United States Patent
Tikart et al.

(12)

(10) Patent No.: US 6,509,414 B2
(45) Date of Patent: *Jan. 21, 2003

(54) EPOXY RESIN, STYRENE-MALEIC ANHYDRIDE COPOLYMER AND CO-CROSSLINKING AGENT

(75) Inventors: Franz Tikart, Erlenbach (DE); Karl-Heinz Leis, Weilbach (DE)

(73) Assignee: Isola Laminate Systems Corporation, LaCrosse, WI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/269,014

(22) PCT Filed: Sep. 24, 1997

(86) PCT No.: PCT/EP97/05308

§ 371 (c)(1),
(2), (4) Date: Jun. 14, 1999

(87) PCT Pub. No.: WO98/18845

PCT Pub. Date: May 7, 1998

(65) Prior Publication Data

US 2002/0082350 A1 Jun. 27, 2002

(30) Foreign Application Priority Data

Oct. 29, 1996 (EP) .............................. 96203016

(51) Int. Cl.⁷ .......................... C08L 25/08; C08L 63/02
(52) U.S. Cl. .................. 525/115; 525/109; 525/117
(58) Field of Search ................................ 525/115, 117, 525/109

(56) References Cited

U.S. PATENT DOCUMENTS

| 2,707,177 A |   | 4/1955  | Skiff et al. |
|---|---|---|---|
| 3,936,575 A | * | 2/1976  | Watanabe et al. ............ 428/417 |
| 4,042,550 A |   | 8/1977  | Tuller et al. |
| 4,591,623 A |   | 5/1986  | Nakajima et al. ............ 525/524 |
| 4,756,954 A | * | 7/1988  | Berman et al. ............. 525/527 |
| 5,075,155 A | * | 12/1991 | Jellinek et al. ............. 428/209 |

FOREIGN PATENT DOCUMENTS

| DE | 35 21 506 A1 |   | 12/1985 |
|---|---|---|---|
| DE | 3839105 A1   |   | 6/1989  |
| EP | 0 413 386 A1 |   | 2/1991  |
| EP | 0 417 837 A1 |   | 3/1991  |
| GB | 994484       |   | 6/1965  |
| JP | 49-109476    | * | 10/1974 |
| JP | 58-94461     | * | 6/1983  |
| JP | 49-109476    |   | 10/1994 |
| WO | WO 85/03515  |   | 8/1985  |
| WO | WO 86/02085  |   | 4/1986  |
| WO | WO 96/07683  |   | 3/1996  |

OTHER PUBLICATIONS

Maleic and Fumaric Polymers, Bill M. Culbertson, vol. 9, p. 225–294, (1993).

* cited by examiner

*Primary Examiner*—Robert E. L. Sellers
(74) *Attorney, Agent, or Firm*—McDonnell, Boehnen, Hulbert & Berghoff

(57) ABSTRACT

A composition useful as an impregnant for the making of laminates for printed wiring boards comprises a FR4 epoxy resin which is a bisphenol A epoxy resin advanced with tetrabromobisphenol A, a crosslinking agent of a strene-maleic anhydride copolymer and a co-crosslinking agent is an optionally brominated bisphenol A and/or an optionally brominated bisphenol A diglycidyl ether.

18 Claims, No Drawings

EPOXY RESIN, STYRENE-MALEIC ANHYDRIDE COPOLYMER AND CO-CROSSLINKING AGENT

BACKGROUND OF THE INVENTION

The invention pertains to a resin composition comprising a styrene maleic anhydride copolymer as a cross-linking agent (curing agent), an epoxy resin, and a co-cross-linking agent.

The use of cross-linking agents for epoxy resin is described in BE 627,887. This patent also discloses a proposal to use copolymers of maleic anhydride and styrene (SMA) as cross-linking agent for epoxy resin. A drawback to such epoxy resin compositions is that they have low Tg and low thermal stability, rendering them unsuitable for use in prepregs, which are applied in laminates for printed wiring boards (PWBs).

The resin generally used in electrolaminates is an epoxy resin. The present practical standard is the FR4-laminate, which is based on a brominated epoxy resin prepared from a diglycidyl ether of bisphenol-A and tetrabromo-bisphenol-A, dicyanodiamide as curing agent, an organic solvent, and an accelerator. The drawback to such an epoxy resin is its low Tg (110–130° C.), while in addition the dicyanodiamide has a tendency to crystallize in the resin and the prepreg made therefrom.

An improvement has been sought in the preparation of an interpenetrating polymeric network (IPN). Such resin compositions are known from EP 413,386. This document relates to IPNs having very favorable properties, in particular for use in the electronics industry. This is the case when the cross-linking agent used for the epoxy resin is a polybrominated phenol. In actual practice, the embodiment using anhydride cross-linking agents proves unsatisfactory. Notably, the Tg obtained is too low, and the electrical properties and the prepreg stability also leave room for improvement.

In addition, it is desired that the use of inexpensive difunctional epoxy resins should give thermal properties which are of the same standard as can be obtained using the multifunctional epoxy resins preferably employed in EP 413,386. Resins based on multifunctional epoxy compounds have been described in WO 85/03515 and WO 86/02085.

Other publications describing epoxy resin compositions employing anhydrides as cross-linking agent for the epoxy resin are U.S. Pat. No. 2,707,177; DE 3,521,506; GB 994,484; and EP 417,837. This last patent specification teaches the use of ethylenically unsaturated anhydrides, such as maleic anhydride, where the anhydride not only cross-links the epoxy resin but also takes part in the forming of the network.

A solution to the above-mentioned problems has been suggested in WO 96/07683, which discloses a resin composition where the carboxylic anhydride is a copolymer of an ethylenically unsaturated anhydride and a vinyl compound. In such a copolymer the ethylenically unsaturated portion of the anhydride is incorporated into the backbone. The carboxylic anhydride groups remain intact, and they are available as functional groups for cross-linking the epoxy resin. More specifically, those resin compositions contain triallyl cyanurate (TAC) as allyl polymerizing agent. In this type of resin TAC is necessary to obtain compositions with high Tg and acceptable thermal stability, which can be applied in prepregs.

Resin compositions which comprise dicyandiamide as co-cross-linking agent have been disclosed in DE 3,839,105. According to this document, dicyanamide is an essential constituent of the resin composition. Dicyandiamide, however, has the disadvantage that it only dissolves in toxic and expensive solvents, and it would be an advantage to find suitable co-cross-linking agents, devoid of the disadvantages of dicyandiamide.

Epoxy resin compositions containing low-molecular weight copolymers of α-methylstyrene and maleic anhydride have been disclosed in U.S. Pat. No. 4,042,550. Such compositions are unsuitable for the manufacture of PWBs.

Prepregs are widely employed in the manufacture of laminates for the electronics industry, in particular for printed wiring boards. Such manufacture involves impregnating a supporting or reinforcing fabric with a resin, followed by partial curing of said resin. Such impregnated fabric is commonly referred to as prepreg. Manufacturing a printed wiring board involves laminating one or more layers of prepreg with, say, one or more layers of copper.

Processing prepregs into boards usually involves their being cut down to size and laminated. Both these process steps make stringent demands on the resin with which the fabric is impregnated. For instance, the partially cured resin has to have sufficient sturdiness and a high viscosity, yet it must be sufficiently sticky and liquid to give good adhesion when laminated, and hence good interlaminar strength. The resin may not be too highly reactive, since this will render the required partial curing impossible.

In this connection resin compositions where the epoxy resin is cross-linked with an anhydride-containing copolymer have the drawback of being too brittle to be processed as prepregs. For instance, it proves impossible to cut up such prepregs without a portion of the resin blowing about in the form of a large quantity of dry dust. This is sometimes called a "mushroom effect," after mushroom spores blowing about.

It has now been found that in contrast to the previous solutions for obtaining suitable polymers for use in prepregs, IPNs are not necessary, and that epoxy resins free from TAC can be prepared having high Tg and/or improved thermal stability.

On the one hand, the invention has the object to enhance the thermal and electrical properties of resin compositions based on epoxy resin cross-linked with styrene maleic anhydride copolymer (SMA). On the other hand, the invention envisages resin compositions based on difunctional epoxy resin which have thermal and electrical properties comparable to IPNs the resin composition of which is based on multifunctional epoxy compounds. Furthermore, the invention aims to provide resin compositions where the problem of brittleness, which occurs when SMA is used as epoxy cross-linking agent, can be prevented.

SUMMARY OF THE INVENTION

To this end, the invention consists of a resin composition comprising a copolymer of styrene and maleic anhydride (SMA) as cross-linking agent, an epoxy resin, and a co-cross-linking agent, characterized in that the co-cross-linking agent is an optionally brominated bisphenol A (BPA), or an optionally brominated bisphenol A diglycidyl ether (BPADGE), or a mixture thereof, and that the composition is free from an allyl network forming compound.

DESCRIPTION OF THE PREFERRED EMBODIMENTS

It is known from WO 96/07683 that epoxy resin compositions which are free from allyl network forming compound, such as TAC, have low Tg, usually not higher than 130° C., and low thermal stability. The present invention is based on the finding that use of BPA as co-cross-linking agent significantly improves the thermal stability of the co-polymer. To this same end it was found that BPADGE as co-cross-linking agent considerably increases the Tg, so that Tg values of 190° C. are attainable. Preferably, the co-cross-linking agent is a brominated BPA, a brominated BPADGE, or a mixture thereof. More preferably, the co-cross-linking agent is tetrabromobisphenol A (TBBPA) or tetrabromobisphenol A diglycidyl ether (TBBPADGE). Most preferably, the co-cross-linking agent is a mixture of tetrabromobisphenol A (TBBPA) and tetrabromobisphenol A diglycidyl ether, leading to resin compositions with high thermal stability and a high Tg. Moreover, the stability of prepregs made of the resin composition of the invention is considerably improved with respect to the prior art prepregs. A further advantage is that post-curing, which is necessary with IPNs, is not longer required.

Copolymers of styrene and maleic anhydride have been described, inter alia, in *Encyclopedia of Polymer Science and Engineering* Vol. 9 (1987), page 225 ff. Within the framework of the invention the term "copolymer" likewise refers to SMA or mixtures of SMA.

Copolymers of styrene and maleic anhydrides (SMA) are commercially available in two types. Type 2 comprises mostly high-molecular weight copolymers (MW generally higher than 100,000, for instance, 1,000,000). These are in fact thermoplasts, which are unsuitable for use in the manufacture of prepregs. Moreover, because of their low anhydride content (5–15%) they are not particularly suitable for use as a cross-linking agent for epoxy resin either. The type 1 SMA copolymers, on the other hand, which have a molecular weight in the range of about 1400 to about 50,000 and an anhydride content of more than 15% by weight, are pre-eminently suited to be used. Preference is also given to SMA copolymers having a molecular weight in the range of 1400 to 10,000. Examples of such copolymers include the commercially available SMA 1000, SMA 2000, SMA 3000, and SMA 4000. These copolymers have a styrene:maleic anhydride ratio of 1:1, 2:1, 3:1, and 4:1, respectively, and a molecular weight ranging from about 1400 to about 2000. Mixtures of these SMAs may also be used.

The amount of copolymer employed can be such as will give an anhydride and aromatic hydroxy groups:epoxy groups equivalency ratio in the range of 50 to 150% to by weight. The preferred ratio is between 75 and 125% by weight, and more preferably between 90 and 110% by weight. Optimum results are obtained when at least 10% by weight of TBBPA and at least 10% by weight of TBBPADGE are employed as co-cross-linking agents.

The term "epoxy resin" in this context refers to a curable composition of oxirane ring-containing compounds as described in C. A. May, *Epoxy Resins*, 2$^{nd}$ Edition, (New York & Basle: Marcel Dekker Inc.), 1988.

Examples of epoxy resins include phenol types such as those based on the diglycidyl ether of bisphenol A, on polyglycidyl ethers of phenol-formaldehyde novolac or cresol-formaldehyde novolac, on the triglycidyl ether of tris(p-hydroxyphenol)methane, or on the tetraglycidyl ether of tetraphenylethane; amine types such as those based on tetraglycidyl-methylenedianiline or on the triglycidyl ether of p-aminoglycol; cycloaliphatic types such as those based on 3,4-epoxycyclohexylmethyl-3,4-epoxycyclohexane carboxylate. The term "epoxy resin" also stands for reaction products of compounds containing an excess of epoxy (for instance, of the aforementioned types) and aromatic dihydroxy compounds. These compounds may be halogen substituted.

Preference is given to epoxy resins which are derivative of bisphenol A, particularly FR4, especially on account of their low price. FR4 is made by an advancing reaction of an excess of bisphenol A diglycidyl ether with tetrabromobisphenol A. Mixtures of epoxy resins with bismaleimide resin, cyanate resin and/or bismaleimide triazine resin can also be applied.

It should be noted that epoxy resins are generally represented by a single, unequivocal structural formula. The skilled person will know that this should be taken to include deviating products resulting from side reactions occurring during epoxy resin preparation. As these side products constitute a normal component of cured epoxy resins, they likewise constitute a normal component of the resins according to the invention.

The BPA and BPADGE may optionally be brominated, i.e. substituted with one or more bromine atoms. Brominated co-cross-linking agents are preferred because of their flame retarding properties. Preferably, the aromatic moieties of both BPA and BPADGE are substituted with two bromine atoms, to give tetrabromo substituted TBBPA and TBBPADGE, respectively. Optionally brominated novolacs can also be used as co-cross-linking agent.

Cross-linking of the epoxy resin generally proceeds with the aid of an accelerator. As suitable accelerators may be mentioned imidazoles, more particularly alkyl substituted imidazoles such as 2-methylimidazole and 2-ethyl-4-methylimidazole, and tertiary amines, e.g. benzyldimethylamine.

The amount used of such an accelerator is dependent on the type of epoxy resin, the type of cross-linking agent, and the type of accelerator. Employing a too large amount of accelerator will lead to a too highly reactive resin system. Such a system is not serviceable for making prepregs. The skilled person can easily determine within which range a resin system will be just sufficiently little reactive to allow ready processing into prepregs. In general, such a processing range will be between 0.01 and 5% by weight of accelerator, calculated on the overall weight of epoxy resin and cross-linking agent. In many cases this will be the 0.01–0.075 % by weight range. The gel time for its part is dependent on the type and amount of accelerator, the type and amount of solvent, and the type of prepreg to be manufactured. In the specific case of 2-methylimidazole (2MI) being used as accelerator, it is preferred not to use more than about 0.05% by weight of 2MI. By way of general guideline it can be said that it is advisable not to have a varnish gel time of less than 120 seconds.

The desired resin properties determine the amount of BPA and BPADGE to be incorporated into the resin. According to the invention, for instance, it has surprisingly been found that the Tg of epoxy resins cross-linked with SMA can be increased substantially by the use of at least 5% by weight of BPA. Most surprisingly of all, it is now possible, as indicated above, to obtain resins having glass transition temperatures of 130° C. and higher even with simple difunctional epoxy compounds.

As a rule, an organic solvent is employed when preparing resins according to the invention. If a solvent is used, it must be one in which the epoxy resin, cross-linking agent, and co-cross-linking agent are soluble, while the solvent itself should be sufficiently volatile to evaporate before or during the curing.

As suitable solvents may be mentioned dimethylformamide; glycol ethers such as ethylene glycol mono-ethyl ether or propylene glycol mono-ethyl ether and their esters such as ethylene glycol mono-ethyl ether acetate; ketones such as methyl isobutyl ketone, methylethyl ketone, acetone, and methyl isopropyl ketone; and aromatic hydrocarbons such as toluene and xylene. Alternatively, mixtures of solvents can be employed. The preferred solvents are ketones, notably acetone and methylethyl ketone, or mixtures of these with ethers, notably propylene glycol mono-ethyl ether.

The invention further pertains to laminates for use in the electronics industry incorporating resins of the aforementioned type.

Laminates for use in the electronics industry (particularly for printed wiring boards) are generally produced by impregnating a supporting or reinforcing material (usually based on glass fibres, either as a woven fabric or in the form of a cross-ply laminate of unidirectionally oriented parallel filaments) with a resin, followed by the resin being cured wholly or in part. The latter process is the most common one, and a fabric impregnated with a partially cured resin is usually referred to as a "prepreg." To make a printed wiring board from a prepreg fabric one or more layers of the prepreg are laminated with, say, one or more layers of copper.

The resins according to the invention are highly suitable for impregnating, e.g., woven fabric and cloth of a variety of materials such as glass, quartz, carbon, aramid, and boron fibres, more particularly to make laminates for printed wiring boards. This application preferably calls for the resin to be employed in combination with a glass fabric.

It was found that even when it is based on simple difunctional epoxy compounds, the combination of resin components according to the invention will give excellent properties for application in the electronics industry. The Tg effect has been mentioned earlier: as compared with the corresponding standard epoxy resins (cured with dicyanodiamide) the resins according to the invention have a Tg of about 30–50° C. higher. Furthermore, it was found that resins according to the invention exhibit a much better resistance to short, intense temperature increases than do standard FR4 epoxy resin and IPNs according to EP 413,386 and have better prepreg stability. The thermal stability is demonstrated by the pressure cooker test and the solder shock test, which are known to the skilled man. The pressure cooker test is a procedure for evaluating glass epoxy laminate integrity. In this test a specimen of the laminate to be tested is placed in a pressure cooker for some time, after which the specimen is immersed in a solder bath at 260° C. The specimen is thereafter graded on the occurrence of measles, blisters, delamination, convolution, and surface erosion. The longer the cooker time without said occurrence is, the more thermally stable the laminate will be. In the solder shock test a material is transferred abruptly from room temperature to solder having a temperature of 288° C. The material (in this case a laminate made of a resin according to the invention) floats in the solder, and so will be subject to a temperature gradient (and hence a tension gradient). The material should be capable of withstanding these conditions for at least 30 seconds without bubble formation or delamination occurring. The longer the material can stand the test, the more serviceable it will be for use in printed wiring boards. The resins according to the invention are capable of standing the solder shock test for 10 minutes, which represents a substantial improvement over both the aforementioned known IPNs, which bear it for about 3 minutes, and FR4 epoxy resin (about 4 minutes).

Furthermore, the resins according to the invention exhibit a significant reduction of dielectric loss.

Also, the resins according to the invention can be employed wherever use is made of conventional epoxy resins: as a glue, coating, molding resin, embedding resin, encapsulating resin, sheet molding compound, bulk molding compound.

In addition to being used as composites for printed wiring boards, the resins according to the invention can be employed to make composites for, inter alia, the construction, aviation, and automobile industries. The manufacture of appropriate structural composites may proceed in a known manner, e.g., by impregnating reinforcing material with molten or dissolved resin, or via resin transfer molding, filament winding, pultrusion, or RIM (reaction injection molding).

The resins according to the invention may contain the usual additives such as dyes or pigments, thixotropic agents, fluidity control agents, and stabilizers.

The invention will be further illustrated with reference to the following examples.

EXAMPLE 1

In a typical example 925 g of BPADGE (DER 535 EK 80) were mixed under stirring with methylethyl ketone (MEK) to a 80% solution. To this solution were added subsequently 1560 g of SMA 3000 as a 50% solution in MEK, 200 g of TBBPA, 280 g of TBBPADGE (Quatrex 6410), 400 g of MEK, and 8 g of a 10% solution of accelerator (2-methylimidazole) in methoxypropanol. The concentration of the accelerator is 0.04% relative to the solid contents of the complete resin. The equivalency ratio of anhydride and aromatic hydroxy groups:epoxy groups is 125%. The resin was stirred for 1 h, after which a gel time of 200 sec at 171° C. was measured. The resin solution was fed into the trough of the impregnated device. The glass web (style no. 7628) was continuously drawn through the trough and through the heating zone. In the heating zone the solvent was evaporated and the resin was partially cured. The prepreg was run through the cooling zone and then cut into sheets. A standard lay-up was prepared from 8 prepregs sheets and copper foil on both sides. The lay-up was pressed to a laminate for 1 h at 1400 kPa and 171° C., and the laminate was post-cured for 2 h at 200° C. This laminate proved to have very good thermal properties with a Tg of 175° C., and an excellent solder bath stability after 6 h in the pressure cooker.

EXAMPLE 2

The following resin compositions were prepared according to above-mentioned proceedings (Example 1) (percentages by weight).

| FR4 (%) | TBBPA (%) | TBBPADGE (%) | SMA (%) | SMA type | Tg (° C.) | Pressure Cooker Test (h) |
|---|---|---|---|---|---|---|
| 61 | 12 | — | 27 | 3000 | 149 | 6 |
| 66 | 13 | — | 21 | 2000 | 137 | 6 |
| 37 | 10 | 14 | 39 | 3000 | 175 | 6 |
| 36 | 3 | 21 | 40 | 3000 | 176 | 3 |
| 30 | — | 27 | 43 | 3000 | 186 | 2 |
| 40 | — | 24 | 36 | 2000 | 186 | 3 |
| 56 | — | 17 | 27 | 1000 | 190 | 1 |

EXAMPLE 3

The Tg of laminates made from resin compositions having different equivalency ratio (eq ratio) of anhydride and aromatic hydroxy groups:epoxy groups was determined by TMA and DSC. The laminates were made at a prepreging temperature of 171° C., pressed for 1 h at 171° C. and 1400 kPa, and post-cured for 2h at 200° C.

| eq ratio (%) | TMA-Tg (° C.) | DSC-Tg (° C.) | mean value (° C.) |
|---|---|---|---|
| 70 | 116 | 122 | 119 |
| 90 | 148 | 149 | 149 |
| 110 | 150 | 155 | 153 |
| 130 | 138 | 150 | 144 |
| 150 | 134 | 137 | 136 |

EXAMPLE 4

The Tg (mean value of TMA-Tg and DSC-Tg) of laminates made from resin compositions having different equivalency ratio (eq ratio) of anhydride and aromatic hydroxy groups:epoxy groups was determined in relation to the post-curing (PC) conditions. The results were compared with two prior art TAC-containing laminates. The laminates were made at a prepreging temperature of 171° C., pressed for 1 h at 171° C. and 1400 kPa, and post-cured as indicated.

| resin type | eq ratio (%) | Tg (° C.) no PC | Tg (° C.) PC: 185° C.; 2 h | Tg (° C.) PC: 200° C.; 2 h |
|---|---|---|---|---|
| this invention | 70 | 112 | 122 | 119 |
| this invention | 110 | 149 | 155 | 153 |
| this invention | 130 | 140 | 146 | 144 |
| this invention | 150 | 136 | 138 | 136 |
| prior art resin A | 90 | 169 | 171 | 181 |
| prior art resin B | 90 | 160 | 172 | 181 |

What is claimed is:

1. A resin composition comprising an FR4 epoxy resin, a copolymer of styrene and maleic anhydride (SMA) as a first cross-linking agent, and a second cross-linking agent selected from the group consisting of brominated bisphenol A (BPA), brominated bisphenol A diglycidyl ether (BPADGE), and a mixture thereof, wherein the composition is free from an allyl network forming compound.

2. The resin composition of claim 1 wherein the co-cross-linking agent is tetrabromobisphenol A (TBBPA), tetrabromobisphenol A diglycidyl ether (TBBPADGE), or a mixture thereof.

3. The resin composition of claim 1 wherein the SMA has a molecular weight of from about 1400 to about 50,000, and an anhydride content of more than 15% by weight.

4. The resin composition of claim 1 wherein the SMA is selected from one SMA or a mixture of SMAs having a styrene:maleic anhydride ratio of 1:1, 2:1, or 4:1, and a molecular weight from about 1400 to about 2,000.

5. The resin composition according to claim 1 wherein a copolymer is used such as to give an equivalency ratio of anhydride and aromatic hydroxy groups:epoxy groups in the range of 50 to 150% by weight.

6. The resin composition according to claim 1 wherein a copolymer is used such as to give an equivalency ratio of anhydride and aromatic hydroxy groups:epoxy groups in the range of 75 to 125% by weight.

7. The resin composition according to claim 1 wherein a copolymer is used such as to give an equivalency ratio of anhydride and aromatic hydroxy groups:epoxy groups in the range of 90 to 110% by weight.

8. The resin composition of claim 2 wherein the SMA has a molecular weight of about 1400 to about 50,000, and an anhydride content of more than 15% by weight.

9. The resin composition of claim 3 wherein the SMA has a molecular weight of from about 1400 to about 50,000, and an anhydride content of more than 15% by weight.

10. The resin composition of claim 4 wherein the SMA has a molecular weight of from about 1400 to about 50,000, and an anhydride content of more than 15% by weight.

11. The resin composition of claim 2 wherein the SMA is selected from one SMA or a mixture of SMA's having a styrene:maleic anhydride ratio of 1:1 to 4:1, and a molecular weight of from about 1400 to about 2,000.

12. The resin composition of claim 3 wherein the SMA is selected from one SMA or a mixture of SMA's having a styrene:maleic anhydride ratio of 1:1 to 4:1, and a molecular weight of from about 1400 to about 2,000.

13. The resin composition of claim 4 wherein the SMA is selected from one SMA or a mixture of SMA's having a styrene:maleic anhydride ratio of 1:1 to 4:1, and a molecular weight of about 1400 to about 2,000.

14. The resin composition according to claim 2 wherein a copolymer is used such as to give an equivalency ratio of anhydride and aromatic hydroxy groups:epoxy groups in the range of 50 to 150% by weight.

15. The resin composition of claim 2 wherein the co-cross-linking agent is a mixture of tetrabromobisphenol A (TBBPA) and tetrabromobisphenol A diglycidyl ether (TBBPADGE).

16. The resin composition of claim 15 wherein at least 10% by weight of TBBPA and at least 10% by weight TBBPADGE are employed.

17. The resin composition of claim 15 wherein the SMA has a molecular weight of from about 1400 to about 50,000, and an anhydride content of more than 15% by weight.

18. The resin composition of claim 15 wherein the SMA is selected from one SMA or a mixture of SMAs having a styrene:maleic anhydride ratio of 1:1, 2:1, or 4:1 and a molecular weight of from about 1400 to about 2,000.

* * * * *

UNITED STATES PATENT AND TRADEMARK OFFICE
CERTIFICATE OF CORRECTION

PATENT NO. : 6,509,414 B2  
APPLICATION NO. : 09/269014  
DATED : January 21, 2003  
INVENTOR(S) : Franz Tikart et al.

It is certified that error appears in the above-identified patent and that said Letters Patent is hereby corrected as shown below:

Title page, item [75], inventors: add --Karl Walter Kopp--

Signed and Sealed this

Eighteenth Day of November, 2008

JON W. DUDAS  
*Director of the United States Patent and Trademark Office*